(12) United States Patent
Tsukamoto et al.

(10) Patent No.: US 8,034,176 B2
(45) Date of Patent: Oct. 11, 2011

(54) GAS DISTRIBUTION SYSTEM FOR A POST-ETCH TREATMENT SYSTEM

(75) Inventors: Yuji Tsukamoto, Wilmington, MA (US); H. Steven Tomozawa, Derry, NH (US); Sam Yong Kim, Lexington, MA (US); Thomas Hamelin, Georgetown, MA (US)

(73) Assignee: Tokyo Electron Limited, Tokyo (JP)

( * ) Notice: Subject to any disclaimer, the term of this patent is extended or adjusted under 35 U.S.C. 154(b) by 916 days.

(21) Appl. No.: 11/390,196

(22) Filed: Mar. 28, 2006

(65) Prior Publication Data

US 2007/0235137 A1    Oct. 11, 2007

(51) Int. Cl.
*C23C 16/453* (2006.01)
(52) U.S. Cl. ............... 118/715; 156/345.33; 156/345.34
(58) Field of Classification Search ............... 118/715; 156/345.33, 345.34
See application file for complete search history.

(56) References Cited

U.S. PATENT DOCUMENTS

| | | | | |
|---|---|---|---|---|
| 3,996,025 A | * | 12/1976 | Gulden | 48/107 |
| 5,191,218 A | * | 3/1993 | Mori et al. | 250/453.11 |
| 5,529,657 A | * | 6/1996 | Ishii | 156/345.26 |
| 5,571,366 A | * | 11/1996 | Ishii et al. | 156/345.26 |
| 5,574,247 A | * | 11/1996 | Nishitani et al. | 118/708 |
| 5,884,009 A | * | 3/1999 | Okase | 392/418 |
| 6,179,920 B1 | * | 1/2001 | Tarutani et al. | 118/715 |
| 6,306,216 B1 | * | 10/2001 | Kim et al. | 118/725 |
| 6,444,039 B1 | * | 9/2002 | Nguyen | 118/715 |
| 2002/0144784 A1 | * | 10/2002 | Curry et al. | 156/345.33 |
| 2002/0185229 A1 | * | 12/2002 | Brcka et al. | 156/345.48 |
| 2003/0010446 A1 | * | 1/2003 | Kajiyama et al. | 156/345.1 |
| 2003/0051665 A1 | * | 3/2003 | Zhao et al. | 118/723 E |
| 2004/0129218 A1 | * | 7/2004 | Takahashi et al. | 118/715 |
| 2005/0150601 A1 | * | 7/2005 | Srivastava | 156/345.33 |
| 2005/0229848 A1 | * | 10/2005 | Shinriki et al. | 118/715 |
| 2005/0270895 A1 | * | 12/2005 | Strang | 366/107 |
| 2007/0032072 A1 | * | 2/2007 | Sidhwa | 438/653 |
| 2007/0163713 A1 | * | 7/2007 | Kasai et al. | 156/345.3 |

* cited by examiner

*Primary Examiner* — Ram Kackar
*Assistant Examiner* — Satish Chandra
(74) *Attorney, Agent, or Firm* — Oblon, Spivak, McClelland, Maier & Neustadt, L.L.P.

(57) ABSTRACT

A post-etch treatment system is described for removing photoresist and etch residue formed during an etching process. For example, the etch residue can include halogen containing material. The post-etch treatment system comprises a vacuum chamber, a remote radical generation system coupled to the vacuum chamber, a radical gas distribution system coupled to the radical generation system and configured to distribute reactive radicals above a substrate, and a high temperature pedestal coupled to the vacuum chamber and configured to support the substrate. The gas distribution system is configured to efficiently transport radicals to the substrate and distribute the radicals above the substrate.

28 Claims, 12 Drawing Sheets

GAS DISTRIBUTION SYSTEM FOR A POST-ETCH TREATMENT SYSTEM

CROSS REFERENCE TO RELATED APPLICATIONS

The present invention is related to co-pending U.S. patent application Ser. No. 11/390,199 entitled "POST-ETCH TREATMENT SYSTEM FOR REMOVING RESIDUE ON A SUBSTRATE," filed on even date herewith, and co-pending U.S. patent application Ser. No. 11/390,192 entitled "METHOD OF REMOVING RESIDUE ON A SUBSTRATE," filed on even date herewith, the entire contents of which are herein incorporated by reference.

BACKGROUND OF THE INVENTION

1. Field of the Invention

The present invention relates to a post-etch treatment system for reduced damage treatment of a substrate following an etching process, and more particularly to a post-etch treatment system having a gas distribution system configured to efficiently transport radicals to the substrate and distribute the radicals above the substrate.

2. Description of Related Art

During semiconductor processing, a (dry) plasma etch process can be utilized to remove or etch material along fine lines or within vias or contacts patterned on a silicon substrate. The plasma etch process generally involves positioning a semiconductor substrate with an overlying patterned, protective mask layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a fraction of the gas species present are ionized by electrons heated via the transfer of radio frequency (RF) power either inductively or capacitively, or via microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide ($SiO_2$), low dielectric constant (i.e., low-k) dielectric materials, poly-silicon, and silicon nitride. Once the pattern is transferred from the patterned mask layer to the underlying layer, using, for example, dry plasma etching, the remaining layer of photoresist, and post-etch residues, are removed via an ashing (or stripping) process. For instance, in conventional ashing processes, the substrate having the remaining photoresist layer is exposed to an oxygen plasma formed from the introduction of diatomic oxygen ($O_2$) and ionization/dissociation thereof. However, formation of plasma in close proximity with the substrate can lead to uncontrolled exposure to high energy charged particles (e.g., energetic electrons, etc.) and electromagnetic (EM) radiation (e.g., ultraviolet (UV) radiation), which may cause damage to underlying layers and/or structures that is unacceptable to the device manufacturers.

SUMMARY OF THE INVENTION

The present invention relates to a system for treating a substrate, and to a system for treating a substrate with atomic or molecular radicals.

According to one embodiment, a treatment system is described for removing residue on a substrate using a flow of atomic or molecular radicals.

According to another embodiment, a treatment system includes a process chamber, including a process space; a remote radical generation system coupled to the process chamber and configured to receive process gas and produce radicals from the process gas; a gas distribution system configured to distribute the radicals within the process space. The gas distribution system includes a diffuser having a diffuser inlet coupled to an outlet of the radical generation system and a diffuser outlet coupled to the process space in the process chamber. The diffuser includes a substantially conical volume. A pedestal is coupled to the process chamber and configured to support a substrate in the process chamber and adjust the temperature of the substrate, and a vacuum pumping system coupled to the process chamber and configured to evacuate the process chamber. According to another aspect of the invention, a treatment system includes a process chamber, including a process space, and a remote radical generation system coupled to said process chamber and configured to receive process gas and produce radicals from said process gas. A radical delivery system configured to receive and deliver a flow of said radicals within said process space, wherein said radical system includes a duct having a duct inlet coupled to an outlet of said radical generation system and a duct coupled to a plenum. A gas distribution plate is coupled to an outlet of said plenum and configured to disperse said radicals to the process space, and a pedestal coupled to said process chamber and configured to support a substrate in said process chamber and adjust the temperature of said substrate. A vacuum pumping system is coupled to said process chamber and configured to evacuate said process chamber.

Another aspect of the invention is a treatment system including a process chamber including a process space, means for generating radicals from the process gas and means for delivering said radicals to the process space. A pedestal is coupled to said process chamber and configured to support a substrate in the process chamber and adjust a temperature of the substrate, and a vacuum pumping system coupled to said process chamber and configured to evacuate said process chamber.

DETAILED DESCRIPTION OF PREFERRED EMBODIMENTS

In the following description, in order to facilitate a thorough understanding of the invention and for purposes of explanation and not limitation, specific details are set forth, such as a particular geometry of the treatment system and descriptions of various processes. However, it should be understood that the invention may be practiced in other embodiments that depart from these specific details.

In material processing methodologies, pattern etching comprises the application of a thin layer of light-sensitive material, such as photoresist, to an upper surface of a substrate, which is subsequently patterned in order to provide a mask for transferring this pattern to the underlying thin film on a substrate during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photoresist), or non-irradiated regions (as in the case of negative resist) using a developing solvent.

Figure 1A:
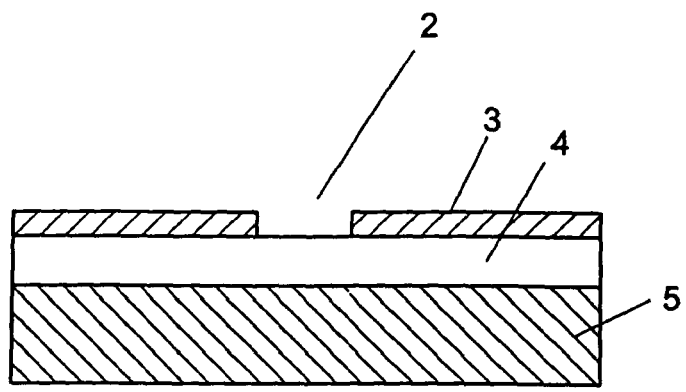
FIGS. 1A, 1B, and 1C show a schematic representation of a procedure for pattern etching a thin film.
Figure 1B:
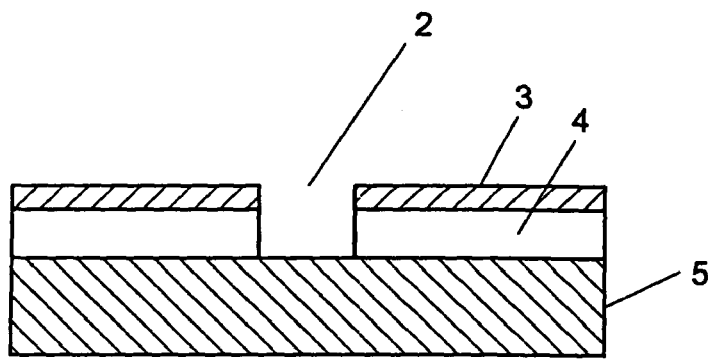
Figure 1C:
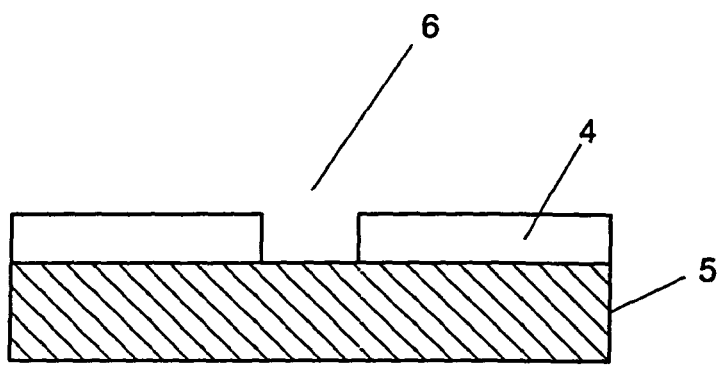

For example, as shown in FIGS. 1A through 1C, a mask comprising light-sensitive layer 3 with pattern 2 (such as patterned photoresist) can be utilized for transferring feature patterns into a thin film 4 on a substrate 5. The pattern 2 is transferred to the thin film 4 using, for instance, dry plasma etching, in order to form feature 6, and upon completion of etching, the mask 3 is removed. Conventionally, the mask 3, as well as other residue such as halogen residue from polysilicon etching, are removed by immersing the substrate in plasma, such as an oxygen plasma, and the remaining mask and post-etch residue are ashed (or stripped). However, when dry cleaning substrates having sensitive or delicate structures or layers, such as during front-end-of-line (FEOL) applications in semiconductor manufacturing, direct exposure to plasma can have detrimental effects due to the presence of energetic (charged) particles, electro-magnetic (EM) radiation, etc.

Figure 2:
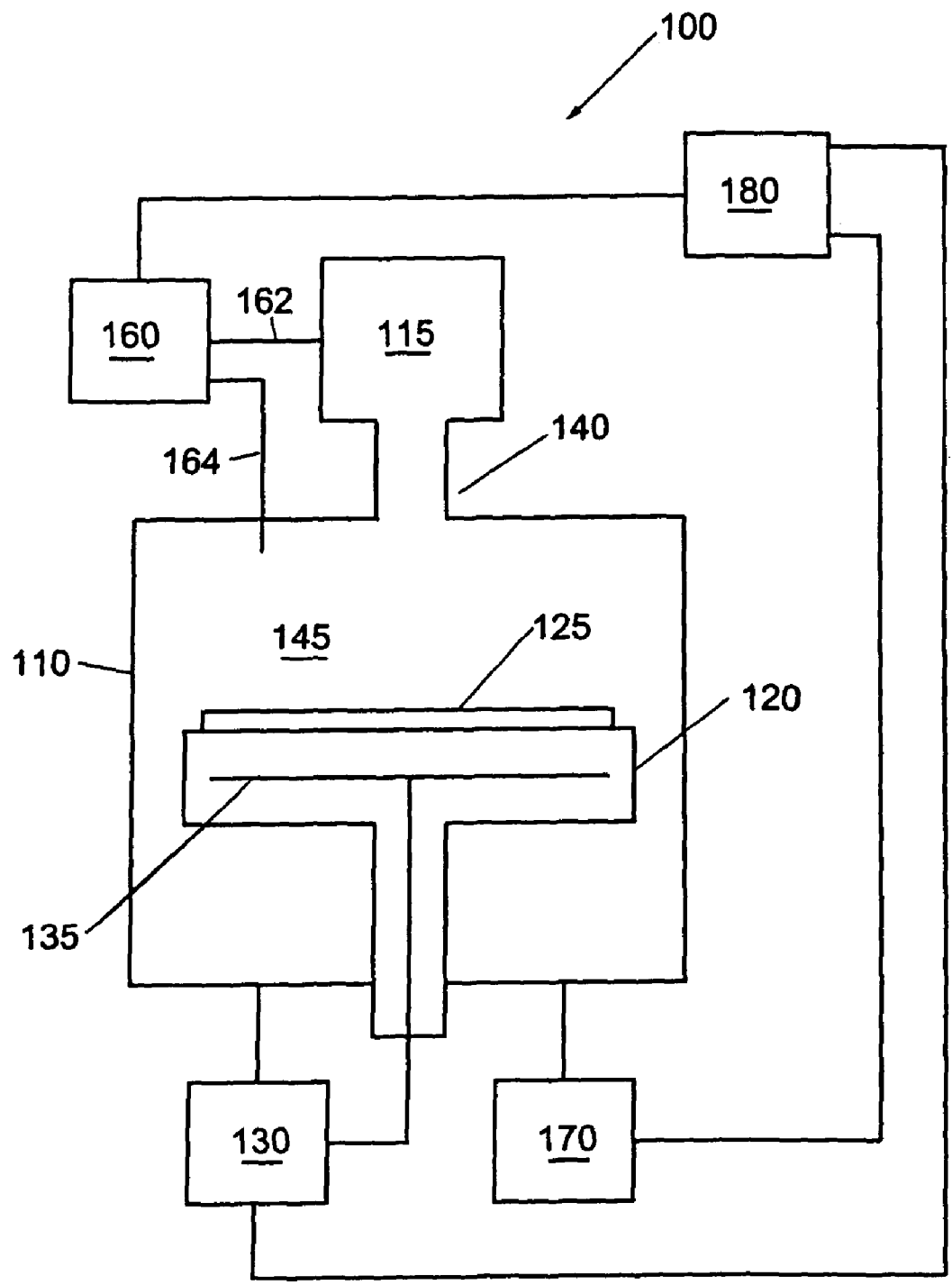
FIG. 2 shows a schematic diagram of a treatment system according to an embodiment of the present invention.

According to one embodiment, a treatment system 100 is depicted in FIG. 2 comprising a process chamber 110 having a pedestal 120 configured to support a substrate 125, upon which a treatment process, such as a post-etch treatment process, is performed. Substrate 125 can be, for example, a semiconductor substrate, a wafer or a liquid crystal display. Additionally, a radical generation system 115 is coupled to the process chamber 110 via a radical delivery system 140.

The process chamber 110 is further coupled to a vacuum pumping system 170 through a duct and a pressure control system (e.g., vacuum valve, etc.), wherein the pumping system 170 is configured to evacuate the process chamber 110, the radical delivery system 140, and the radical generation system 115 to a pressure suitable for performing the treatment process on substrate 125, and suitable for production of radicals in the radical generation system 115.

Referring still to FIG. 2, the radical generation system 115 is configured to remotely generate atomic radicals or molecular radicals or both from a process gas supplied from a gas supply system 160 through one or more gas supply conduits 162. The radicals formed remotely in radical generation system 115 are transported through radical delivery system 140 and introduced to process space 145 above substrate 125. The radical delivery system 140 introduces the radicals to process space 145 while providing minimal impedance to the flow of radicals and inhibiting the recombination of radicals prior to reaching the substrate surface. For example, the radical delivery system may include a duct having a duct inlet coupled to an outlet of the radical generation system 115, and a duct outlet coupled to the process chamber 110.

The radical generation system 115 is configured to produce one or more chemical radicals configured to chemically react with and remove any remaining mask layer or residual photoresist, post-etch residue, etc. with minimal damage to substrate 125. For example, the radical generation system 115 can include an upstream plasma source configured to generate oxygen or fluorine radical from a process gas comprising an oxygen containing gas, or a fluorine containing gas, or both. For instance, the process gas can include oxygen ($O_2$), CO, $CO_2$, NO, $NO_2$, $N_2O$ (or, more generally, $N_xO_y$), $N_2$, nitrogen trifluoride ($NF_3$), $NH_3$, $O_3$, $XeF_2$, $ClF_3$, or $C_3F_8$ (or, more generally, $C_xF_y$), or any combination of two or more thereof, respectively. The radical generation system 115 can include an Astron® reactive gas generator, commercially available from MKS Instruments, Inc., ASTeX® Products (90 Industrial Way, Wilmington, Mass. 01887).

In addition to supplying process gas to radical generation system 115, gas supply system 160 can be further configured to supply an auxiliary process gas to radical generation system 115 through the one or more gas supply conduits 162. The auxiliary process gas can be utilized as a carrier gas to assist the transport of radicals formed in the radical generation system 115 to process space 145, or the auxiliary process gas can be utilized to dilute the process gas and radicals formed from the process gas. The auxiliary gas may include an inert gas, such as a noble gas (i.e., He, Ne, Ar, Kr, Xe), or nitrogen ($N_2$), or a combination thereof. For example, the addition of nitrogen to the radical generation system 115 with oxygen ($O_2$) can assist the dissociation of $O_2$. Furthermore, the gas supply system 160 can be configured to introduce the auxiliary process gas directly to process chamber 110 through one or more auxiliary gas supply conduits 164.

Although not shown, the gas supply system 160 can comprise one or more gas sources, one or more control valves, one or more filters, and/or one or more mass flow controllers. For instance, the flow rate of process gas or auxiliary process gas can range from approximately 1 sccm (standard cubic centimeters per minute) to approximately 10000 sccm (or 10 standard liters per minute, slm). For example, the flow rate of process gas or auxiliary process gas can range from about 1 slm to about 5 slm. By way of further example, the flow rate of process gas or auxiliary process gas can range from about 3 slm to about 5 slm.

Downstream from the radical generation system 115, radicals flow through the radical delivery system 140 and into process space 145 within process chamber 110. The radical delivery system 140 can be coupled to a vapor line temperature control system (not shown) in order to control the temperature. For example, the temperature can be set to a value ranging from approximately 20 degrees C. to approximately 100 degrees C., and by way of another example, the temperature can be set to a value ranging from about 40 degrees C. to about 80 degrees C. Additionally, for example, the radical delivery system 140 can be characterized by a high conductance in excess of about 50 liters/second.

Once radical flow enters the process space 145, the radicals chemically react with residues on the surfaces of substrate 125. The pedestal 120 is configured to elevate the temperature of substrate 125 by virtue of a heating element 135 embedded within pedestal 120 being coupled to a temperature control system 130. Heating element 135 may be a resistive heating element, or heating element 135 may comprise an array of thermoelectric devices. Additional details for the use of thermoelectric devices in a substrate holder are provided in pending U.S. patent application Ser. No. 10/809,787, entitled "METHOD AND APPARATUS FOR RAPID TEMPERATURE CHANGE AND CONTROL" and filed on, the entire contents of which are herein incorporated by reference. For example, the temperature control system 130 can be configured to elevate the temperature of substrate 125 up to approximately 500° C. In one embodiment, the substrate temperature can range from about 40° C. to about 500° C. In another embodiment, the substrate temperature can range from about 100° C. to about 300° C. Additionally, process chamber 110 can be coupled to temperature control system 130 configured to control the temperature of the chamber walls.

In addition to elevating the temperature of substrate 125, pedestal 120 is configured to support substrate 125 during treatment. The pedestal 120 can further comprise a lift pin assembly (not shown) capable of raising and lowering three or more lift pins in order to vertically transfer substrate 125 to and from an upper surface of the pedestal 120 and a transfer plane in the process chamber 110.

In the lift pin assembly, the substrate lift pins can be coupled to a common lift pin element, and can be lowered to below the upper surface of pedestal 120. A drive mechanism (not shown) utilizing, for example, an electric drive system (having an electric stepper motor and threaded rod) or a pneumatic drive system (having an air cylinder), provides means for raising and lowering the common lift pin element. Substrate 125 can be transferred into and out of process chamber 110 through a gate valve (not shown) and chamber feed-through passage, aligned on the transfer plane, via a robotic transfer system (not shown), and received by the substrate lift pins. Once the substrate 125 is received from the transfer system, it can be lowered to the upper surface of the pedestal 120 by lowering the substrate lift pins.

The present inventors have recognized that conventional treatment systems such as post-etch cleaving systems include substrate clamping mechanisms (e.g. electrostatic chuck) to hold the substrate and/or substrate back-side gas flow systems to facilitate temperature control of the wafer. While such features may be used with some embodiments of the invention, the present inventors determined that substrate clamping and/or wafer back-side gas flow is not necessary for post-etch cleaning processes, particularly where a remote radical generator is used. That is, the present inventors discovered that the pedestal of a post-etch cleaning system can be simplified to substantially reduce cost. Thus, according to one embodiment of the present invention, the treatment system includes a pedestal that does not have a clamping mechanism, does not have a back side gas flow mechanism, or does not have either of these features.

In order to prevent the substrate from moving or slipping on pedestal 120, the upper surface of pedestal 120 can be scored with one or more grooves, wherein at least one of the one or more grooves extends to an edge of the pedestal. During the translation of substrate 125 to the upper surface of pedestal 120, the one or more grooves in the upper surface of pedestal 120 minimize, for example, the formation of a lubrication layer that may enable movement (or slippage) of substrate 125. At least one of the one or more grooves extends to the edge of pedestal 120 in order to permit the escape of ambient gases trapped between the backside of substrate 125 and the upper surface of pedestal 120, which may cause the formation of the lubrication layer.

Furthermore, during the translation of substrate 125 from the upper surface of pedestal 120, the one or more grooves in the upper surface of pedestal 120 minimize, for example, the sticking (due to suction) of substrate 125 to pedestal 120 when initially displacing the substrate 125 from the upper surface of pedestal 120. At least one of the one or more grooves extends to the edge of pedestal 120 in order to permit the penetration of ambient gases between the backside of substrate 125 and the upper surface of pedestal 120 to ease the substrate lift-off.

Figure 9:
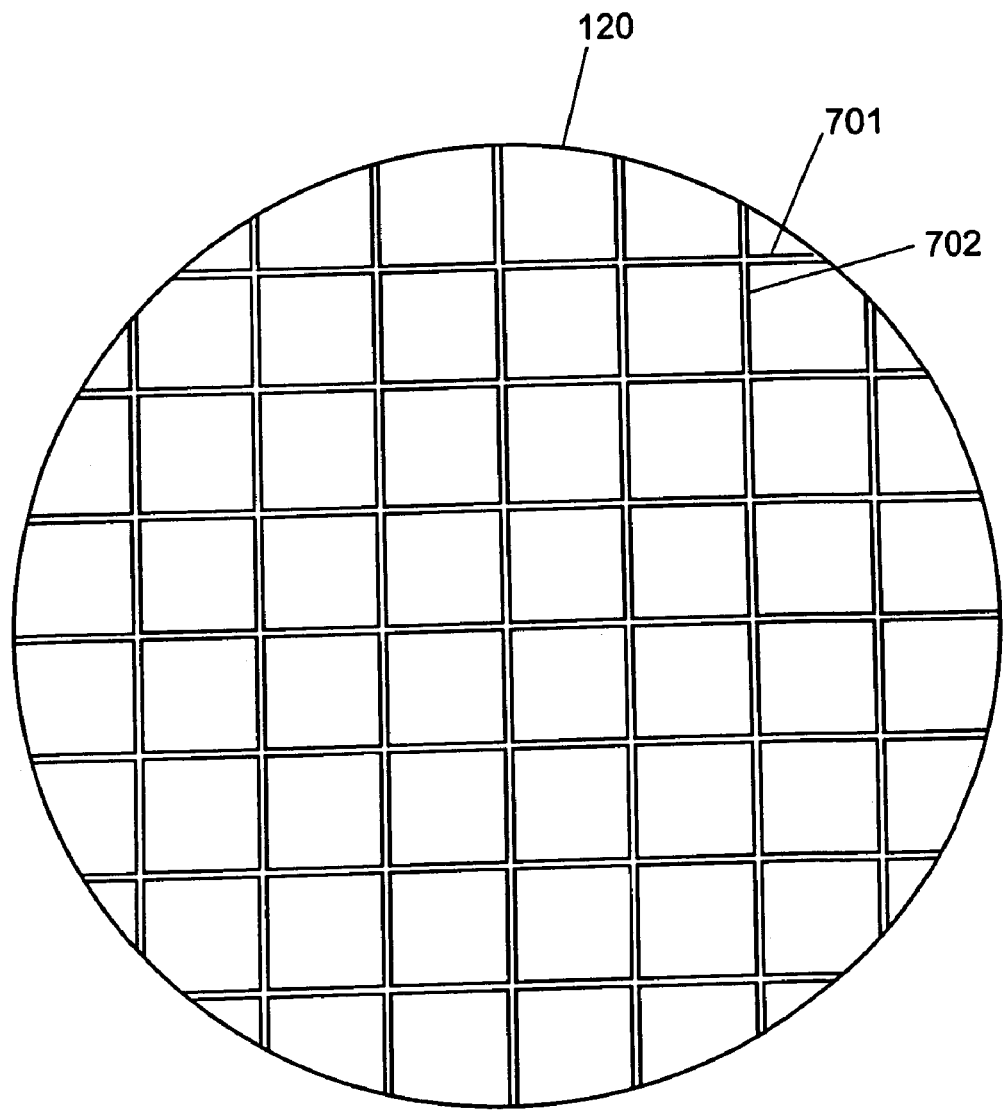
FIG. 9 presents a top view of an upper surface of a substrate holder according to an embodiment of the present invention.
Figure 10:
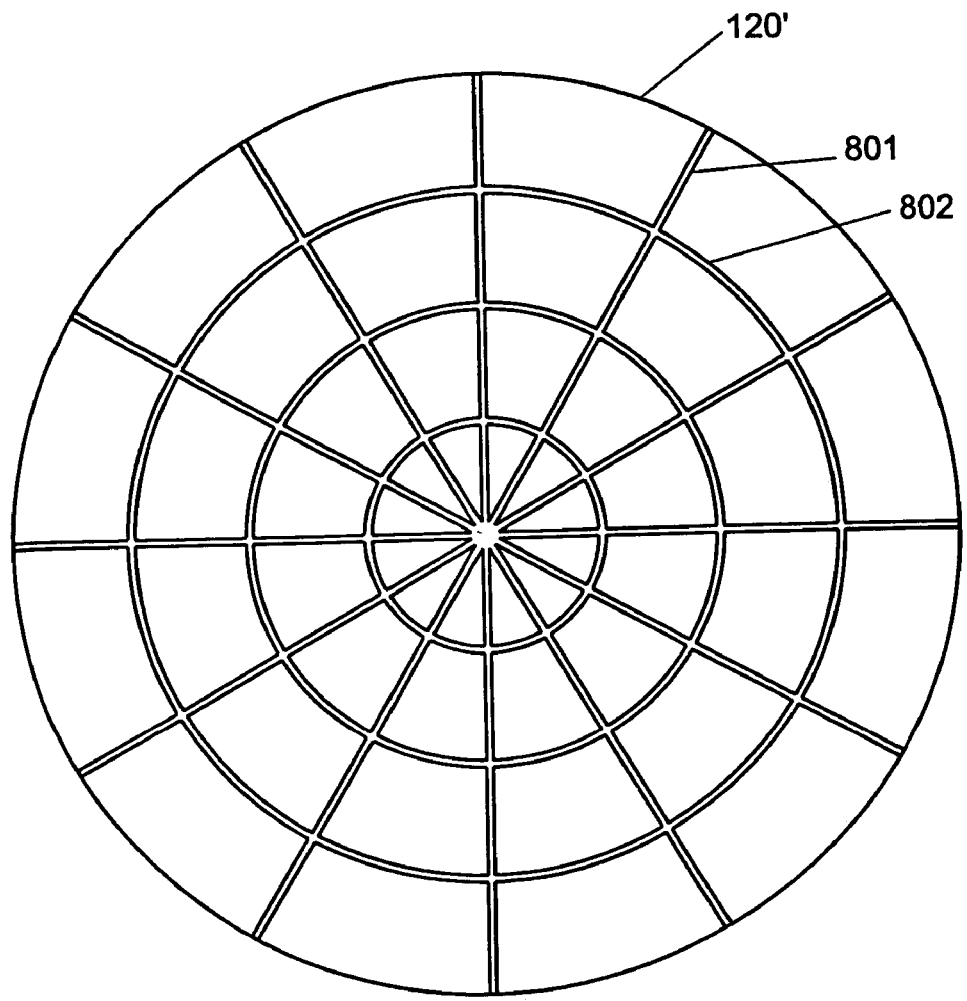
FIG. 10 presents a top view of an upper surface of a substrate holder according to another embodiment of the present invention.
Figure 11:
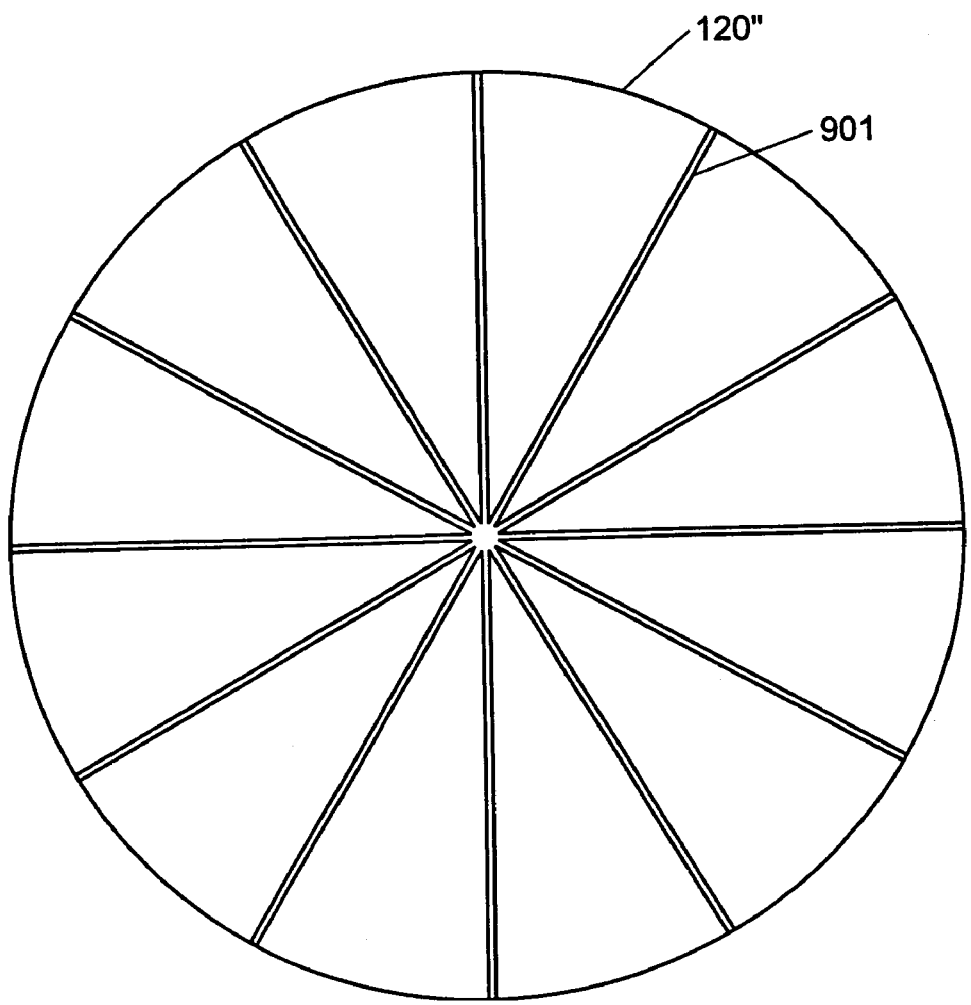
FIG. 11 presents a top view of an upper surface of a substrate holder according to another embodiment of the present invention.

Referring now to FIGS. 9 through 11, several examples are provided for scoring the upper surface of a pedestal with one or more grooves. The pedestal configuration shown in any one of FIGS. 9-11 can be used in any of the processing systems disclosed herein. FIG. 9 depicts pedestal 120 having a first array of grooves 701 and a second array of grooves 702 that form a substantially rectangular pattern. The first array of grooves 701 and the second array of grooves 702 are substantially perpendicular to one another and extend to the peripheral edge of pedestal 120. FIG. 10 depicts pedestal 120' having a first array of substantially radial grooves 801 and a second array of substantially circular grooves 802 that form a substantially circular pattern. The first array of grooves 801 and the second array of grooves 802 are substantially perpendicular to one another, and the first array of radial grooves 801 extend to the peripheral edge of pedestal 120'. FIG. 11 depicts pedestal 120" having an array of substantially radial grooves 901 that extend to the peripheral edge of pedestal 120".

As illustrated in FIG. 2, an exhaust line connects process chamber 110 to vacuum pumping system 170. Vacuum pumping system 170 comprises a vacuum pump to evacuate process chamber 110 to the desired degree of vacuum, and to remove gaseous species from the process chamber 110 during processing. An automatic pressure controller (APC) and an optional trap can be used in series with the vacuum pump. The vacuum pump can include a dry roughing pump. Alternatively, the vacuum pump can include a turbo-molecular pump (TMP) capable of a pumping speed up to 5000 liters per second (and greater). During processing, the process gas, or auxiliary process gas, or any combination thereof, can be introduced into the process chamber 110, and the chamber pressure can be adjusted by the APC. For example, the chamber pressure can range from approximately 1 mTorr to approximately 50 Torr, and in a further example, the chamber pressure can range from about 1 Torr to about 10 Torr. The APC can comprise a butterfly-type valve, or a gate valve. The trap can collect by-products from the process chamber 110.

Additionally, any element within treatment system 100 can be coated with a ceramic material, such as aluminum oxide or yttrium oxide. For example, any element may be coated with a material selected from the group consisting of $Al_2O_3$, $Sc_2O_3$, $Sc_2F_3$, $YF_3$, $La_2O_3$, $Y_2O_3$, and $DyO_3$.

Still referring the FIG. 2, the treatment system 100 can further include a control system 180 configured to operate, and control the operation of the treatment system 100. The control system 180 is coupled to the process chamber 110, the pedestal 120, the temperature control system 130, the radical generation system 115, the gas supply system 160, and the vacuum pumping system 170.

The control system 180 can include a microprocessor, a memory, and a digital I/O port capable of generating control voltages sufficient to communicate and activate inputs of the treatment system 100 as well as monitor outputs from the treatment system 100. Moreover, the control system 180 is coupled to and exchanges information with process chamber 110, the pedestal 120, the temperature control system 130, the radical generation system 115, the gas supply system 160, and the vacuum pumping system 170. A program stored in the memory is utilized to control the aforementioned components of treatment system 100 according to a stored process recipe. One example of processing system control system 180 is a DELL PRECISION WORKSTATION 610™, available from Dell Corporation, Dallas, Tex. The control system 180 may also be implemented as a general-purpose computer, digital signal process, etc.

However, the control system 180 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 180 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the control system 180, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the control system 180 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to a processor of controller for execution. For example, the instructions may initially be carried on a magnetic disk of a remote computer. The remote computer can load the instructions for implementing all or a portion of the present invention remotely into a dynamic memory and send the instructions over a network to the controller 180.

Control system 180 may be locally located relative to the treatment system 100, or it may be remotely located relative to the treatment system 100 via an internet or intranet. Thus, control system 180 can exchange data with the treatment system 100 using at least one of a direct connection, an intranet, or the internet. Control system 180 may be coupled to an intranet at a customer site (i.e., a device maker, etc.), or coupled to an intranet at a vendor site (i.e., an equipment manufacturer). Furthermore, another computer (i.e., controller, server, etc.) can access control system 180 to exchange data via at least one of a direct connection, an intranet, or the internet.

As noted above, the treatment system 100 of FIG. 2 provides remote generation of radicals and delivery of such radicals to the substrate within the process chamber. Such a configuration can allow treatment such as post-etch cleaning of the substrate while minimizing damage to the substrate that can be caused by high energy charged particles in close proximity to the substrate. However, use of the remote radical generator can reduce the treatment rate of the substrate and/or cause non-uniform treatment of the substrate. The present inventors have discovered that design features such as geometry of the radical delivery system can affect the uniform distribution of radicals, as well as the recombination of rate of radicals which affects treatment rate at the substrate. Generally, unimpeded flow of the radicals to the substrate surface reduces recombination to improve treatment rate, but provides poor uniformity of treatment. Conversely, providing impediments to the gas flow (such as a distribution plate) can improve uniformity, but reduce treatment rate. Thus, embodiments of the present invention include different radical delivery systems that control uniform substrate treatment, and/or substrate treatment rate.

Figure 3:
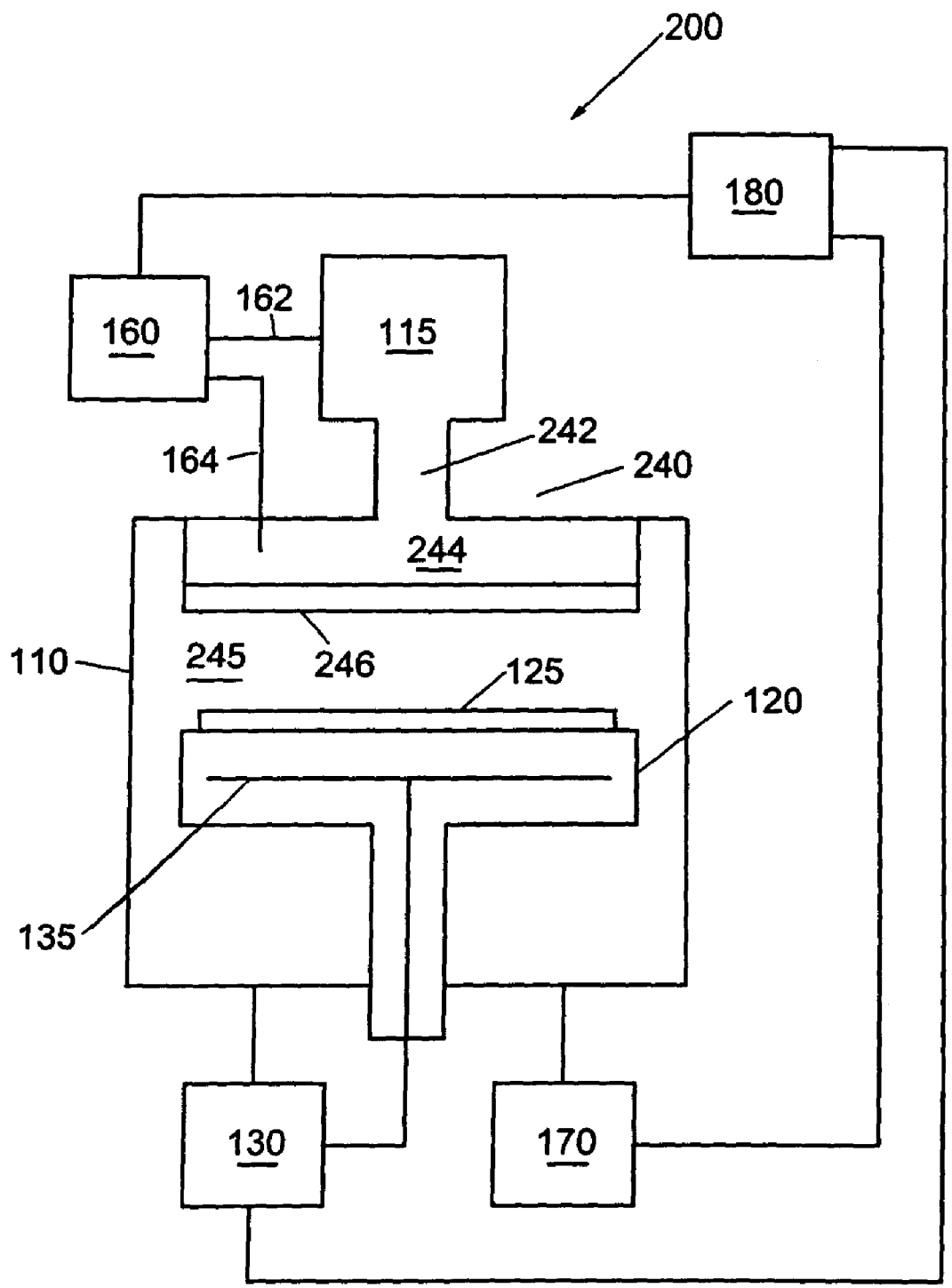
FIG. 3 shows a schematic diagram of a treatment system according to another embodiment of the present invention.

Referring now to FIG. 3, a treatment system 200 is depicted according to another embodiment. The treatment system 200 can, for example, be similar to the embodiment of FIG. 2, wherein like reference numerals designate same or similar components. Treatment system 200 comprises a radical delivery system 240 having a gas distribution plenum 244 coupled to an outlet of the radical generation system 115 through duct 242. The gas distribution plenum distributes radicals received from duct 242 within a process space 245 through a plurality of openings formed in a gas distribution plate 246. The gas distribution plenum 244 comprises a substantially cylindrical volume.

The gas distribution plate 246 can be designed with a plurality of openings ranging in number from approximately 1 opening to approximately 1000 openings, and desirably ranging in number from approximately 10 openings to approximately 100 openings. Additionally, for example, the gas distribution plate 246 can be designed with a plurality of openings, each opening having a diameter ranging from approximately 1 mm to approximately 100 mm, and desirably ranging from approximately 4 mm to approximately 10 mm. Furthermore, for example, the gas distribution plate 246 can be designed with a plurality of openings, each opening having a length ranging from approximately 1 mm to approximately 100 mm, and desirably ranging from approximately 2 mm to approximately 20 mm.

In one embodiment, the one or more openings are distributed uniformly on the gas distribution plate 246. Alternatively, in another embodiment, the distribution of the one or more openings is not uniform. For example, there may be more openings within a peripheral region of gas distribution plate 246 than within a central region of gas distribution plate 246.

The gas distribution plate 246 may be fabricated from a metal, such as aluminum or anodized aluminum, or a ceramic. For example, the gas distribution plate 246 may be fabricated from quartz, silicon, silicon nitride, silicon carbide, alumina, aluminum nitride, etc. Additionally, the gas distribution plate 246 can be coated with a ceramic material, such as aluminum oxide or yttrium oxide. For example, the gas distribution plate 246 may be coated with a material selected from the group consisting of $Al_2O_3$, $Sc_2O_3$, $Sc_2F_3$, $YF_3$, $La_2O_3$, $Y_2O_3$, and $DyO_3$.

Figure 4:
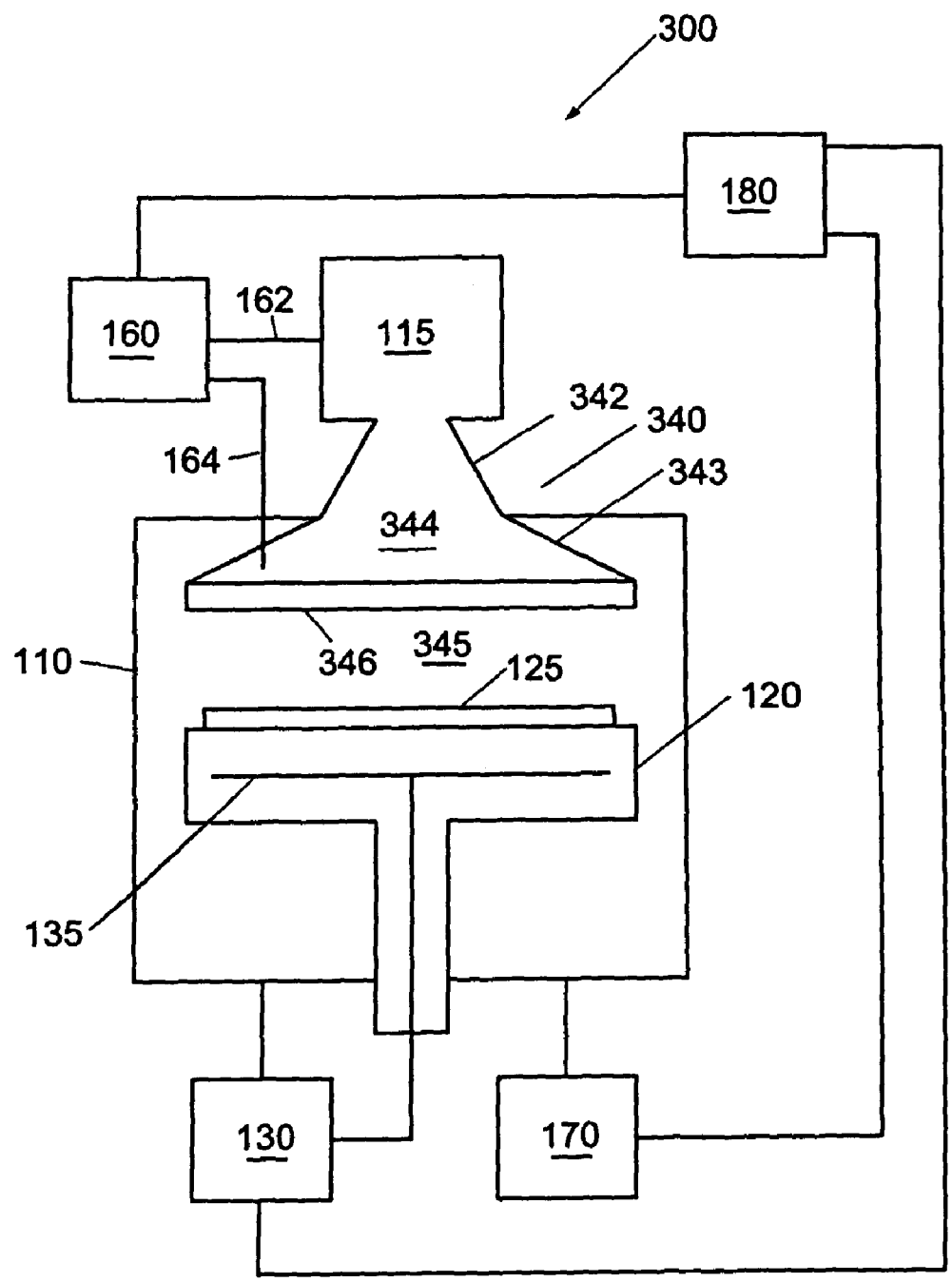
FIG. 4 shows a schematic diagram of a treatment system according to another embodiment of the present invention.

Referring now to FIG. 4, a treatment system 300 is depicted according to another embodiment. The treatment system 300 can, for example, be similar to the embodiment of FIG. 2, wherein like reference numerals designate same or similar components. Treatment system 300 comprises a radical delivery system 340 having a gas diffuser 344 coupled to an outlet of the radical generation system 115. The gas diffuser 344 distributes radicals received from the radical generation system 115 within a process space 345 through a plurality of openings formed in a gas distribution plate 346 coupled to the outlet of the gas diffuser 344. For example, the gas diffuser 344 comprises a substantially conical volume. Additionally, for example, as shown in FIG. 4, the gas diffuser 344 can comprise a first entrant region 342 coupled to a second entrant region 343. The first entrant region 342 and the second entrant region 343 may, for example, be substantially conical, wherein the half angle of the first entrant region 342 is less than the half angle of the second entrant region 343. For example, the half angle of the first entrant region 342 may be less than or equal to approximately 45 degrees. Alternatively, for example, the half angle of the first entrant region 342 may be less than or equal to approximately 20 degrees. Alternatively yet, for example, the half angle of the first entrant region 342 may be less than or equal to approximately 15 degrees. The gas distribution plate 346 can, for example, be similar to the embodiment of FIG. 3.

Figure 5:
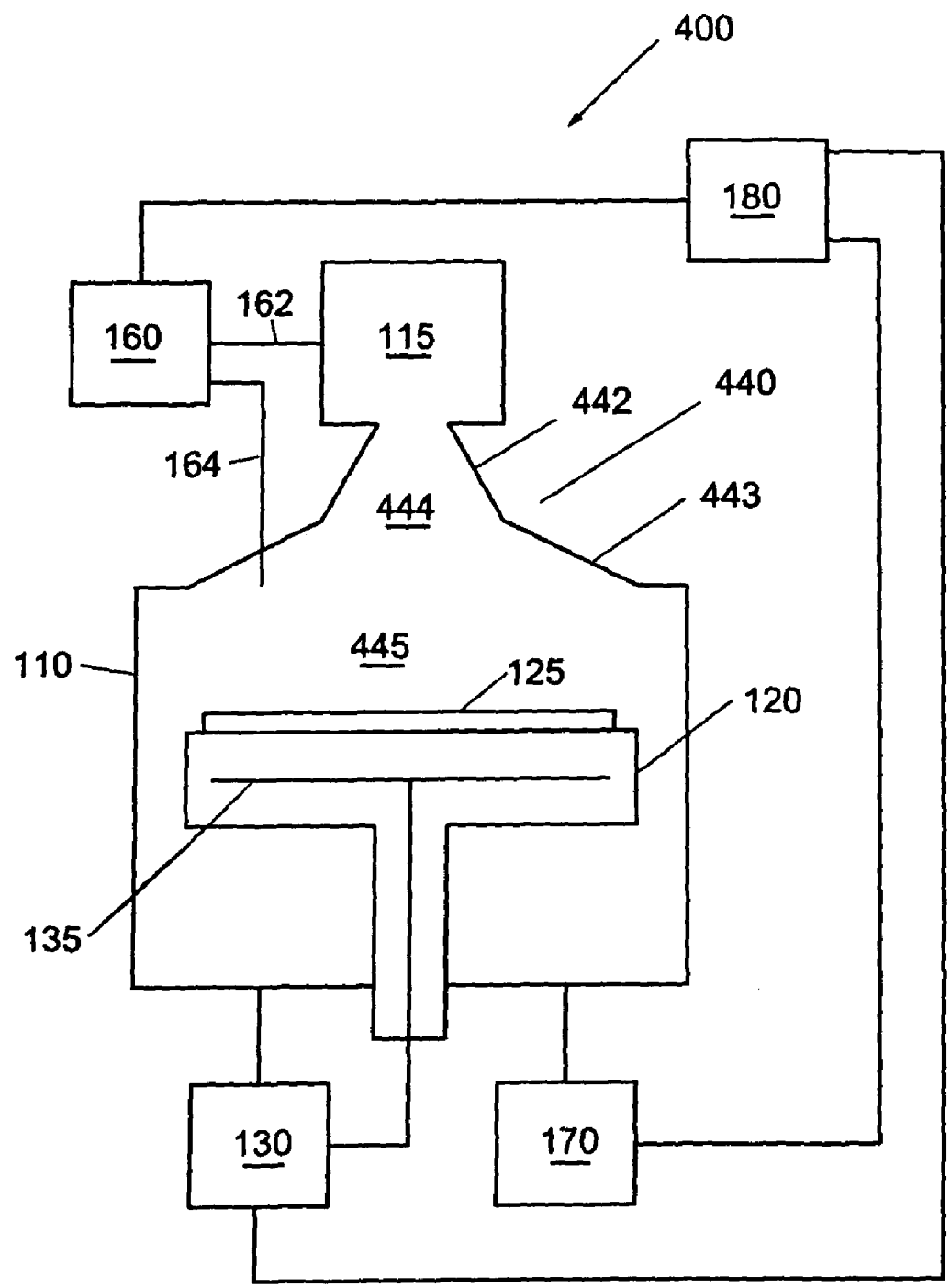
FIG. 5 shows a schematic diagram of a treatment system according to another embodiment of the present invention.

Referring now to FIG. 5, a treatment system 400 is depicted according to another embodiment. The treatment system 400 can, for example, be similar to the embodiment of FIG. 2, wherein like reference numerals designate same or similar components. Treatment system 400 comprises a radical delivery system 440 having a gas diffuser 444 coupled to an outlet of the radical generation system 115. The gas diffuser 444 distributes radicals received from the radical generation system 115 within a process space 445. For example, the gas diffuser 444 comprises a substantially conical volume. Additionally, for example, as shown in FIG. 5, the gas diffuser 444 can comprise a first entrant region 442 coupled to a second entrant region 443. The first entrant region 442 and the second entrant region 443 may, for example, be substantially conical, wherein the half angle of the first entrant region 442 is less than the half angle of the second entrant region 443. For example, the half angle of the first entrant region 442 may be less than or equal to approximately 45 degrees. Alternatively, for example, the half angle of the first entrant region 442 may be less than or equal to approximately 20 degrees. Alternatively yet, for example, the half angle of the first entrant region 442 may be less than or equal to approximately 15 degrees.

Figure 6A:
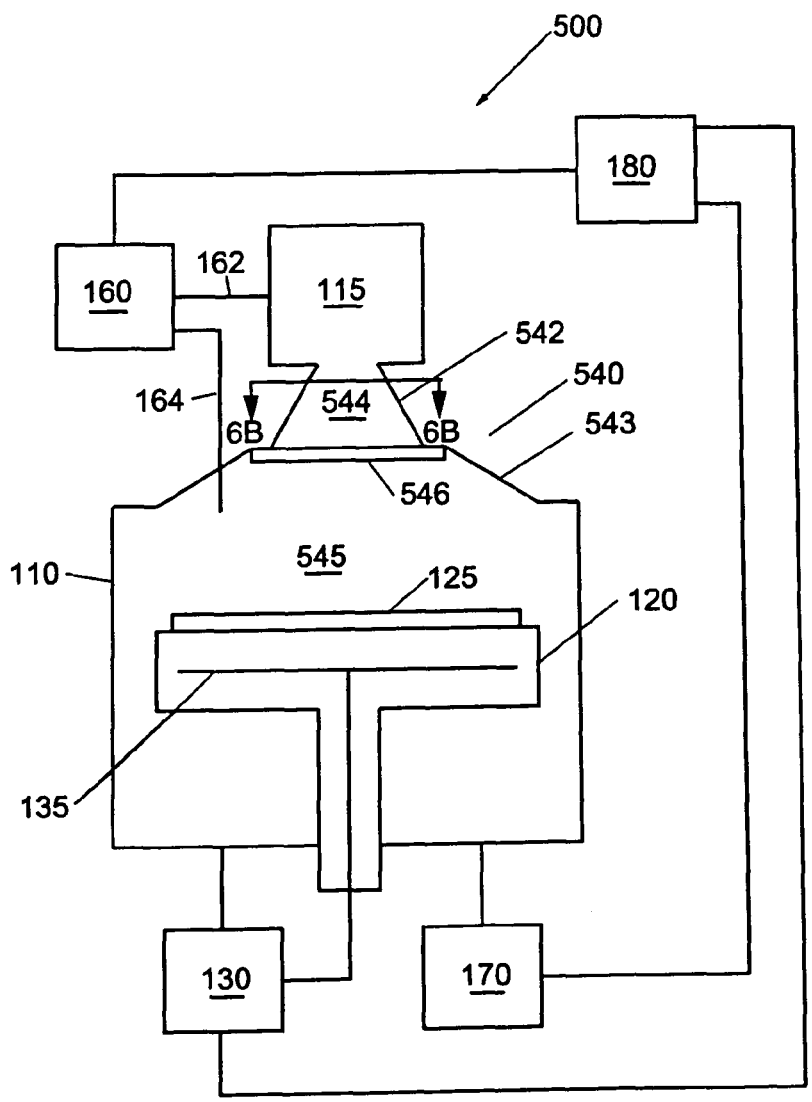
FIGS. 6A and 6B show a schematic diagram of a treatment system according to another embodiment of the present invention.
Figure 6B:
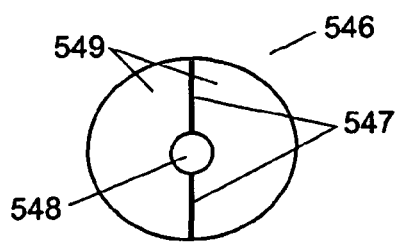

Referring now to FIGS. 6A and 6B, a treatment system 500 is depicted according to another embodiment. The treatment system 500 can, for example, be similar to the embodiment of FIG. 2, wherein like reference numerals designate same or similar components. Treatment system 500 comprises a radical delivery system 540 having a gas diffuser 544 coupled to an outlet of the radical generation system 115. The gas diffuser 544 distributes radicals received from the radical generation system 115 within a process space 545. For example, the gas diffuser 544 comprises a substantially conical volume. Additionally, for example, as shown in FIG. 6A, the gas diffuser 544 can comprise a first entrant region 542 coupled to a second entrant region 543. The first entrant region 542 and the second entrant region 543 may, for example, be substantially conical, wherein the half angle of the first entrant region 542 is less than the half angle of the second entrant region 543. For example, the half angle of the first entrant region 542 may be less than or equal to approximately 45 degrees. Alternatively, for example, the half angle of the first entrant region 542 may be less than or equal to approximately 20 degrees. Alternatively yet, for example, the half angle of the first entrant region 542 may be less than or equal to approximately 15 degrees.

As shown in FIGS. 6A and 6B, a diffuser plate 546 is located between an outlet of the first entrant region 542 and the inlet of the second entrant region 543 of gas diffuser 544. Alternatively, the diffuser plate 546 is located at an outlet of the second entrant region 543 of gas diffuser 544. The diffuser plate 546 comprises a center body 548, such as a disc, supported by one or more support arms 547 (two support arms are shown in FIG. 6B), leaving one or more passages 549 (two passages are shown in FIG. 6B) through which radicals may flow. The center body 548, which may be circular, rectangular, or of any shape, is configured to diffuse the axial momentum of the gas flow emanating from the output of the radical generation system 115. Optionally, as illustrated in FIG. 4, a gas distribution plate may also be used downstream of the diffuser plate 546.

The diffuser plate 546 may be fabricated from a metal, such as aluminum or anodized aluminum, or a ceramic. For example, the diffuser plate 546 may be fabricated from quartz, silicon, silicon nitride, silicon carbide, alumina, aluminum nitride, etc. Additionally, the diffuser plate 546 can be coated with a ceramic material, such as aluminum oxide or yttrium oxide. For example, the diffuser plate 546 may be coated with a material selected from the group consisting of $Al_2O_3$, $Sc_2O_3$, $Sc_2F_3$, $YF_3$, $La_2O_3$, $Y_2O_3$, and $DyO_3$.

Figure 7:
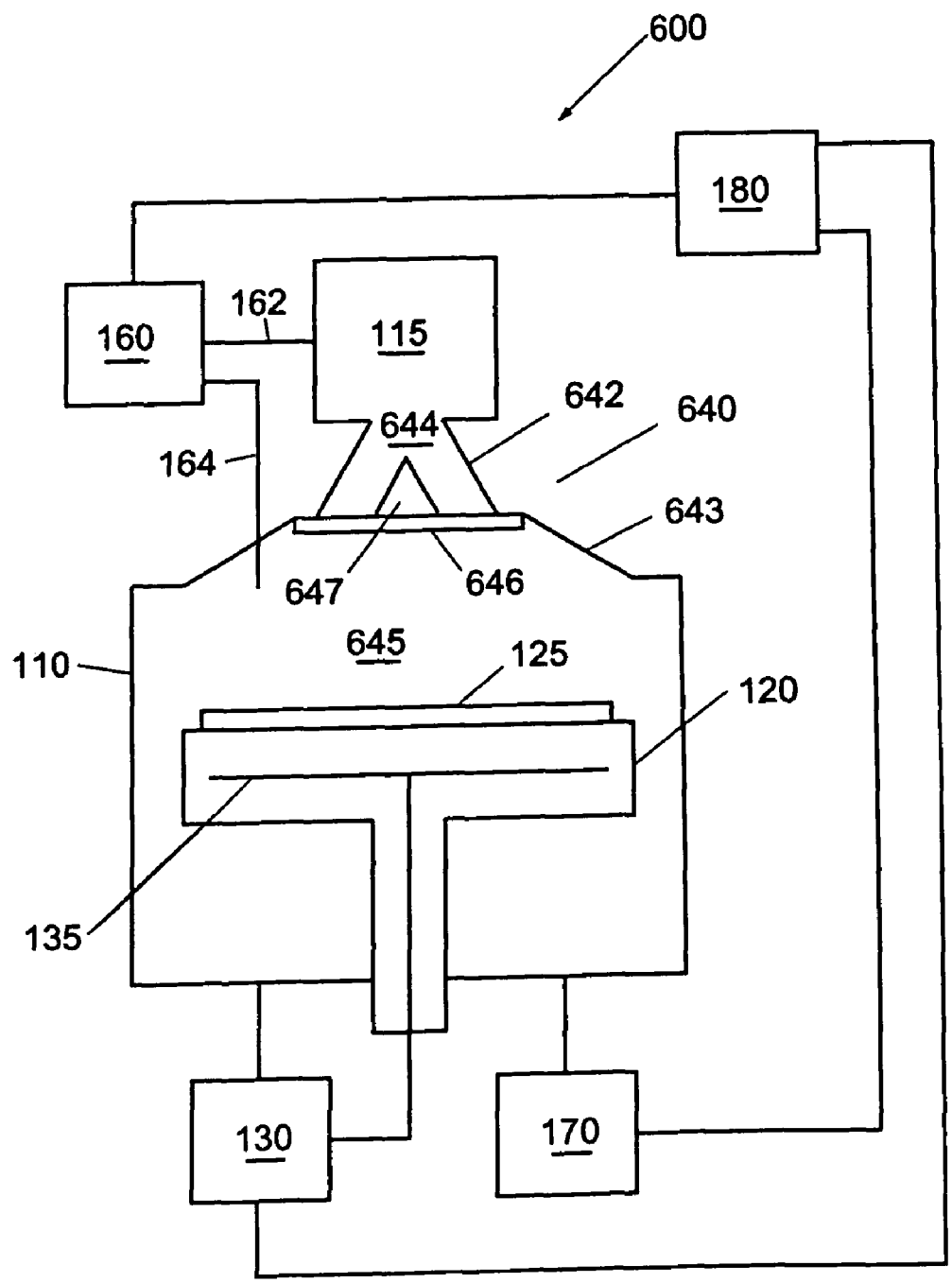
FIG. 7 shows a schematic diagram of a treatment system according to another embodiment of the present invention.

Referring now to FIG. 7, a treatment system 600 is depicted according to another embodiment. The treatment system 600 can, for example, be similar to the embodiment of FIG. 2, wherein like reference numerals designate same or similar components. Treatment system 600 comprises a radical delivery system 640 having a gas diffuser 644 coupled to an outlet of the radical generation system 115. The gas diffuser 644 distributes radicals received from the radical generation system 115 within a process space 645. For example, the gas diffuser 644 comprises a substantially conical volume. Additionally, for example, as shown in FIG. 7, the gas diffuser 644 can comprise a first entrant region 642 coupled to a second entrant region 643. The first entrant region 642 and the second entrant region 643 may, for example, be substantially conical, wherein the half angle of the first entrant region 642 is less than the half angle of the second entrant region 643. For example, the half angle of the first entrant region 642 may be less than or equal to approximately 45 degrees. Alternatively, for example, the half angle of the first entrant region 642 may be less than or equal to approximately 20 degrees. Alternatively yet, for example, the half angle of the first entrant region 642 may be less than or equal to approximately 15 degrees.

As shown in FIG. 7, a diffuser plate 646 is located between an outlet of the first entrant region 642 and the inlet of the second entrant region 643 of gas diffuser 644. Alternatively, the diffuser plate 646 is located at an outlet of the second entrant region 643 of gas diffuser 644. The diffuser plate 646 can, for example, be designed similar to diffuser plate 546 shown in FIGS. 6A and 6B; however, it may further comprise a conical center body 647 supported by two or more support arms, leaving two or more passages through which radicals may flow. The conical diffuser body 647, which may be circular, rectangular, or of any shape, is configured to diffuse the axial momentum of the gas flow emanating from the output of the radical generation, system 115. Optionally, as illustrated in FIG. 4, a gas distribution plate may also be used downstream of the diffuser plate 646.

Figure 8A:
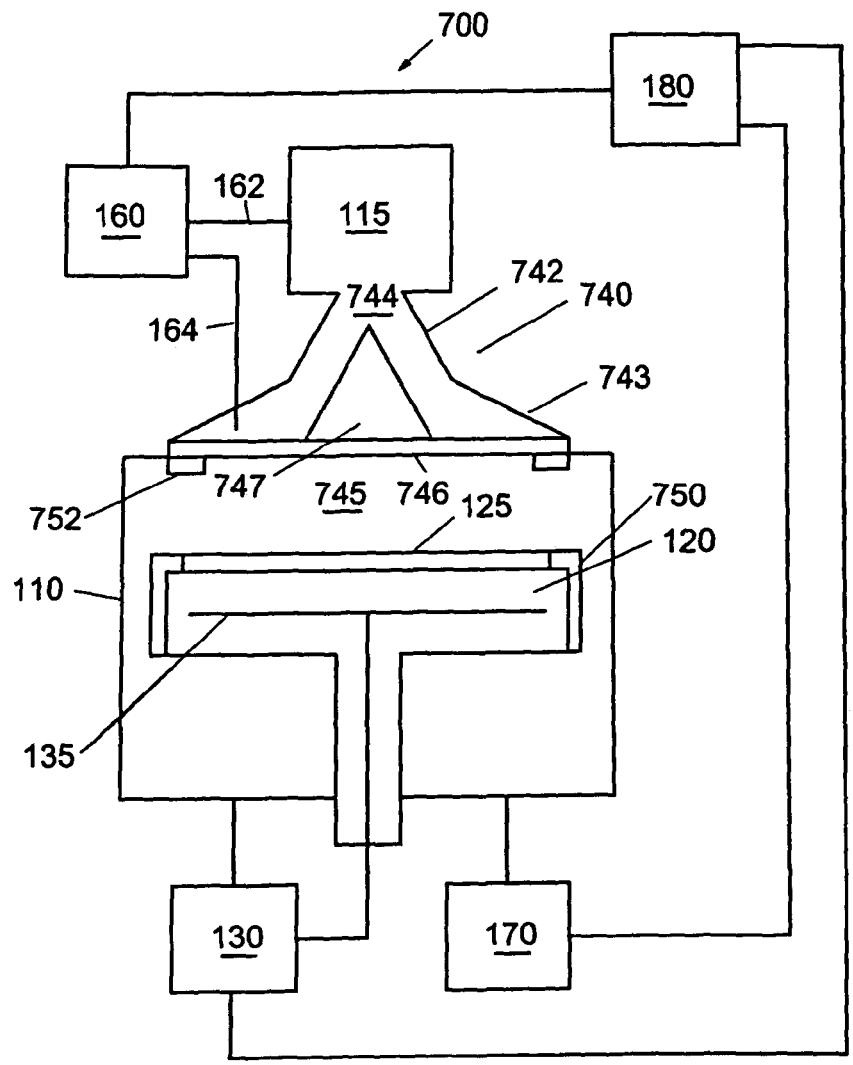
FIGS. 8A and 8B show a schematic diagram of a treatment system according to another embodiment of the present invention.
Figure 8B:
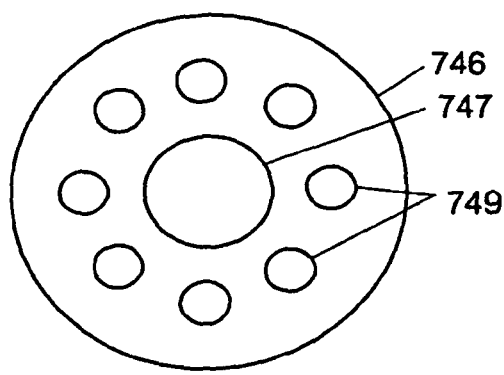

Referring now to FIGS. 8A and 8B, a treatment system 700 is depicted according to another embodiment. The treatment system 700 can, for example, be similar to the embodiment of FIG. 2, wherein like reference numerals designate same or similar components. Treatment system 700 comprises a radical delivery system 740 having a gas diffuser 744 coupled to an outlet of the radical generation system 115. The gas diffuser 744 distributes radicals received from the radical generation system 115 within a process space 745. For example, the gas diffuser 744 comprises a substantially conical volume. Additionally, for example, as shown in FIG. 8A, the gas diffuser 744 can comprise a first entrant region 742 coupled to a second entrant region 743. The first entrant region 742 and the second entrant region 743 may, for example, be substantially conical, wherein the half angle of the first entrant region 742 is less than the half angle of the second entrant region 743. For example, the half angle of the first entrant region 742 may be less than or equal to approximately 45 degrees. Alternatively, for example, the half angle of the first entrant region 742 may be less than or equal to approximately 20 degrees. Alternatively yet, for example, the half angle of the first entrant region 742 may be less than or equal to approximately 15 degrees.

As shown in FIGS. 8A and 8B, a diffuser plate 746 is located at an outlet of the second entrant region 743 of gas diffuser 744. The diffuser plate 746 can, for example, be designed similar to diffuser plate 646 shown in FIG. 7. The diffuser plate 746 comprises a conical center body 747 supported by one or more support arms, leaving one or more passages through which radicals may flow. Alternatively, the diffuser plate 746 comprises a vapor distribution plate configured to support the conical center body 747, wherein a plurality of openings 749 are formed through a peripheral region of the diffuser plate 746 between the base of the conical center body 747 and the inner wall of the second entrant region 743 of gas diffuser 744. The conical center body 747, which may be circular, rectangular, or of any shape, is configured to diffuse the axial momentum of the gas flow emanating from the output of the radical generation system 115.

Referring still to FIGS. 8A and 8B, treatment system 700 may further comprise a pedestal edge ring 750, and/or a diffuser plate edge ring 752, or both, in order to impede the flow of process gases beyond a peripheral edge of substrate 125 to vacuum pumping system 170. The pedestal edge ring 750, or the diffuser plate edge ring 752, or both, may be configured to reduce the flow-through space at the peripheral edge of substrate 125 by anywhere from approximately 10% to approximately 80%, and desirably from approximately 20% to approximately 50%. This can provide more uniform distribution of the radicals across the substrate and/or can improve the treatment rate of the substrate.

The pedestal edge ring 750, or the diffuser plate edge ring 752, or both, may be fabricated from a metal, such as aluminum or anodized aluminum, or a ceramic. For example, each ring may be fabricated from quartz, silicon, silicon nitride, silicon carbide, alumina, aluminum nitride, etc. Additionally, each ring can be coated with a ceramic material, such as aluminum oxide or yttrium oxide. For example, each ring may be coated with a material selected from the group consisting of $Al_2O_3$, $Sc_2O_3$, $Sc_2F_3$, $YF_3$, $La_2O_3$, $Y_2O_3$ and $DyO_3$.

Figure 12:
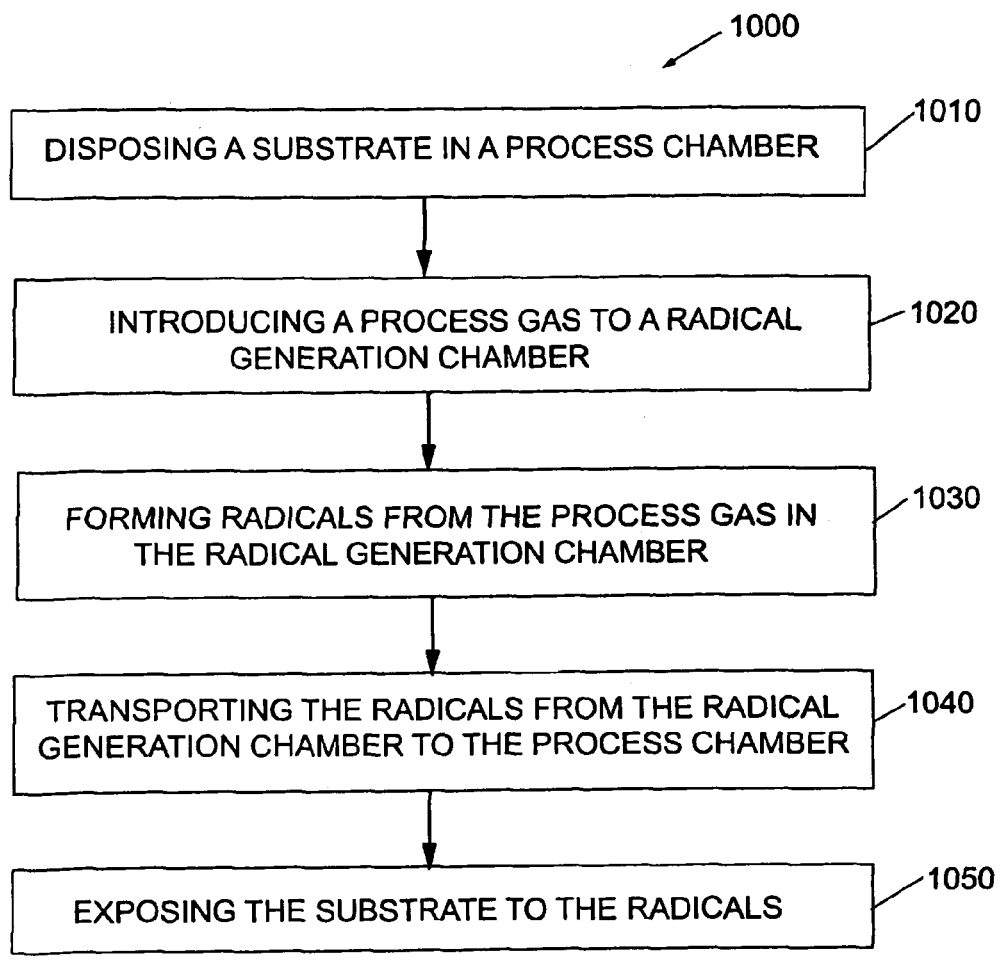
FIG. 12 presents a method of removing residue on a substrate according to an embodiment of the present invention.

FIG. 12 presents a flow chart of a method for removing residue from a substrate according to an embodiment. The flow chart 1000 begins in 1010 with disposing the substrate with the residue on a pedestal in a process chamber. The pedestal may be any of the pedestal configurations of FIGS. 9-11 and process chamber can include any one of the process chambers described in FIGS. 2 through 8, or any combination thereof. The residue may include residue from an etching process.

In 1020, a process gas is introduced to a radical generation chamber coupled to the process chamber. The process gas comprises $N_xO_y$, wherein x and y are integers greater than or equal to unity. The process gas comprises one or more of NO, $N_2O$, or $NO_2$, or a combination of two or more thereof. Preferably, the process gas comprises $N_2O$, which is expected to provide a good treatment rate when using a remote radical generation system such as those disclosed herein. The $N_xO_y$ gas may be used with or without $N_2$ and/or $O_2$ gases as discussed below. Alternatively, the process gas further comprises an oxygen containing gas, such as $O_2$, CO, or $CO_2$, or a combination of two or more thereof. The present inventors have recognized that while an oxygen containing gas may be undesirable for a local plasma due to possible damage to the substrate (particularly in FEOL operations), an oxygen containing gas used in a remote radical generator can facilitate treatment rate of the substrate while minimizing damage.

Alternatively, the process gas further comprises a nitrogen containing gas, such as $N_2$, $NH_3$, or $NF_3$, or a combination of two or more thereof. Alternatively, the process gas further comprises a halogen containing gas, such as $C_xF_y$, wherein x and y are integers greater than or equal to unity. Alternatively yet, the process gas further comprises $N_2$ and $O_2$. Alternatively yet, the process gas consists of $N_2O$, $N_2$ and $O_2$. Alternatively, the process gas further comprises an inert gas, such as a noble gas.

For example, a process parameter space can comprise a chamber pressure of about 1 to about 10 Torr, a process gas flow rate ranging from about 3 to about 5 slm, and a pedestal temperature ranging from about 100 degrees C. to about 300 degrees C.

In 1030, radicals of the process gas are formed in the radical generation chamber. The radicals may be formed by forming plasma and inducing dissociation of the process gas. Alternatively, other techniques for dissociating the process gas may be employed, including electro-magnetic (EM) radiation such as ultraviolet (UV) radiation.

In 1040, the radicals formed from the process gas are transported from the radical generation chamber to the process chamber. For example, the radical may be transported through any one of the radical delivery systems depicted in FIGS. 2 through 8, or any combination thereof.

In 1050, the substrate is exposed to the flow of radicals, and the residue is removed. The substrate may be exposed to radicals while not being exposed to plasma in the radical generation chamber.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A treatment system comprising:
a process chamber, including a process space;
a remote radical generation system coupled to said process chamber and configured to receive process gas and produce radicals from said process gas;
a gas distribution system configured to receive and distribute a flow of said radicals within said process space, wherein said gas distribution system comprises a diffuser having a diffuser inlet coupled to an outlet of said radical generation system and a diffuser outlet coupled to said process space in said process chamber, and wherein said diffuser comprises a first entrant region having a substantially conical volume and a second entrant region having a substantially conical volume;
a diffuser plate located at an outlet of the second entrant region, and including a conical center body supported by the diffuser plate;
a pedestal coupled to said process chamber and configured to support a substrate in said process space of the process chamber and adjust the temperature of said substrate; and
a vacuum pumping system coupled to said process chamber and configured to evacuate said process chamber.

2. The treatment system of claim 1, wherein said diffuser plate further comprises one or more openings there through.

3. The treatment system of claim 2, wherein said plurality of openings are distributed substantially equally on said gas diffuser plate.

4. The treatment system of claim 2, wherein said plurality of openings are distributed unequally on said gas diffuser plate.

5. The treatment system of claim 1, wherein said center body is substantially aligned with the flow of said radicals from said radical generation system, wherein said flow of said radicals passes through said diffuser around said center body to said process space.

6. The treatment system of claim 5, wherein said center body is supported by one or more support arms.

7. The treatment system of claim 1, wherein said first entrant region is proximate said diffuser inlet and said second entrant region is proximate said diffuser outlet, and wherein the half angle of said first entrant region is less than the half angle of said second entrant region.

8. The treatment system of claim 7, where the half angle of said first entrant region is less than or equal to approximately 45 degrees.

9. The treatment system of claim 7, where the half angle of said first entrant region is less than or equal to approximately 15 degrees.

10. The treatment system of claim 7, wherein said center body is substantially aligned with the flow of said radicals from said radical generation system, wherein said flow of said radicals passes through said diffuser around said center body to said process space.

11. The treatment system of claim 10, wherein said center body is supported by one or more support arms.

12. The treatment system of claim 1, wherein said pedestal comprises one or more grooves formed in an upper surface of said pedestal, and wherein at least one of said one or more grooves extends to an edge of said pedestal.

13. The treatment system of claim 1, wherein said pedestal comprises one or more heating elements, or one or more cooling elements, or a combination thereof, for controlling said temperature of said substrate.

14. The treatment system of claim 1, wherein said pedestal is formed of aluminum having a coating thereon.

15. The treatment system of claim 14, wherein said coating is an anodic layer.

16. The treatment system of claim 14, wherein said coating contains at least one column III element.

17. The treatment system of claim 14, wherein said coating contains at least one element selected from the group consisting of $Al_2O_3$, $Sc_2O_3$, $Sc_2F_3$, $YF_3$, $La_2O_3$, $Y_2O_3$, and $DyO_3$.

18. The treatment system of claim 1, wherein said gas distribution system is formed of aluminum having a coating thereon.

19. The treatment system of claim 18, wherein said coating is an anodic layer.

20. The treatment system of claim 18, wherein said coating contains at least one column III element.

21. The treatment system of claim 18, wherein said coating contains at least one element selected from the group consisting of $Al_2O_3$, $Sc_2O_3$, $Sc_2F_3$, $YF_3$, $La_2O_3$, $Y_2O_3$, and $DyO_3$.

22. The treatment system of claim 1, further comprising:
a process gas supply system coupled to said radical generation system, and configured to supply said process gas to said radical generation system.

23. The treatment system of claim 22, wherein said process gas supply system is configured to supply one or more of $O_2$, $N_2$, NO, $NO_2$, $N_2O$, CO, $CO_2$, $NH_3$, $NF_3$, or $CF_4$, or any combination of two or more thereof.

24. The treatment system of claim 1, further comprising:
an edge ring coupled to said process chamber and configured to surround said process space in order to impede the flow of radicals beyond a peripheral edge of said substrate.

25. The treatment system of claim 24, wherein said edge ring comprises a pedestal edge ring coupled to a peripheral edge of said pedestal.

26. The treatment system of claim 1, further comprising:
an edge ring coupled to said process chamber and configured to surround said process space in order to impede the flow of radicals beyond a peripheral edge of said substrate, wherein said edge ring comprises an edge ring coupled to a peripheral edge of said gas distribution system.

27. A treatment system comprising:
a process chamber, including a process space;
a remote radical generation system coupled to said process chamber and configured to receive process gas and produce radicals from said process gas;
a radical delivery system configured to receive and deliver a flow of said radicals within said process space, wherein said radical system comprises a duct having a duct inlet coupled to an outlet of said radical generation system and a duct coupled to a plenum, the plenum including first and second entrant regions, the first and second entrant regions having a substantially cylindrical volume;
a diffuser plate located at an outlet of the second entrant region, and including a conical center body supported by the diffuser plate;
a gas distribution plate coupled to an outlet of said plenum and configured to disperse said radicals to the process space;

a pedestal coupled to said process chamber and configured to support a substrate in said process chamber and adjust the temperature of said substrate; and a vacuum pumping system coupled to said process chamber and configured to evacuate said process chamber.

28. A treatment system comprising:

a process chamber including a process space;

means for generating radicals from the process gas remotely from said process space;

a pair of conical shaped means for delivering said radicals to the process space;

a diffuser plate located at an outlet of said pair of conical shaped means, and including a conical center body supported by the diffuser plate;

a pedestal coupled to said process chamber and configured to support a substrate in the process chamber and adjust a temperature of the substrate; and a vacuum pumping system coupled to said process chamber and configured to evacuate said process chamber.

* * * * *